United States Patent [19]

Blum

[11] 4,428,060

[45] Jan. 24, 1984

[54] SHIFT REGISTER LATCH CIRCUIT MEANS FOR CHECK AND TEST PURPOSES AND CONTAINED IN LSI CIRCUITRY CONFORMING TO LEVEL SENSITIVE SCAN DESIGN (LSSD) RULES AND TECHNIQUES

[75] Inventor: Arnold Blum, Gechingen, Fed. Rep. of Germany

[73] Assignee: International Business Machines Corporation, Armonk, N.Y.

[21] Appl. No.: 264,896

[22] Filed: May 18, 1981

[30] Foreign Application Priority Data

Aug. 9, 1980 [DE] Fed. Rep. of Germany ....... 3030299

[51] Int. Cl.³ .................. G06F 7/00; G11C 19/00
[52] U.S. Cl. .................................. 364/715; 377/78; 377/81
[58] Field of Search ............... 364/715; 377/77, 78, 377/81

[56] References Cited

U.S. PATENT DOCUMENTS

| | | | |
|---|---|---|---|
| 3,239,764 | 3/1966 | Verna et al. | 328/37 |
| 3,746,973 | 7/1973 | McMahon, Jr. | 324/51 |
| 3,761,695 | 9/1973 | Eichelberger | 235/153 |
| 3,781,683 | 12/1973 | Freed | 324/158 |
| 3,781,821 | 12/1973 | Roth | 377/81 X |
| 3,783,254 | 1/1974 | Eichelberger | 235/152 |
| 3,789,205 | 1/1974 | James | 235/153 |
| 3,803,483 | 4/1974 | McMahon, Jr. | 324/51 |
| 3,806,891 | 4/1974 | Eichelberger et al. | 340/172.5 |
| 3,810,115 | 5/1974 | Stafford | 364/900 |
| 3,815,025 | 6/1974 | Jordan | 324/73 |
| 3,961,251 | 6/1976 | Hurley et al. | 324/73 |
| 3,961,252 | 6/1976 | Eichelberger | 324/73 |
| 3,961,254 | 6/1976 | Cavaliere et al. | 324/73 |
| 4,006,492 | 2/1977 | Eichelberger et al. | 357/45 |
| 4,051,352 | 9/1977 | Eichelberger et al. | 364/716 |
| 4,051,353 | 9/1977 | Lee | 364/716 |
| 4,055,754 | 10/1977 | Chesley | 235/302.3 |
| 4,063,078 | 12/1977 | DasGupta et al. | 364/700 |
| 4,063,080 | 12/1977 | Eichelberger et al. | 235/302 |
| 4,071,902 | 1/1978 | Eichelberger et al. | 364/716 |
| 4,074,851 | 2/1978 | Eichelberger et al. | 235/302 |
| 4,140,967 | 2/1979 | Balasubramanian et al. | 325/73 |
| 4,220,917 | 9/1980 | McMahon, Jr. | 324/73 |
| 4,225,957 | 9/1980 | Doty, Jr. et al. | 371/15 |
| 4,244,048 | 1/1981 | Tsui | 371/15 |

OTHER PUBLICATIONS

"Power Minimization of LSSD SRLS" by R. C. Flaker et al., IBM TDB publication, vol. 19, No. 8, Jan. 1977, pp. 2951-2952.

"Introduction to an LSI Test System" by M. Correia et al., 14th Design Automation Conference Proceedings, Jun. 20, 21 & 22, 1977, New Orleans, La. IEEE Catalog No. 77, CH1216-1C, pp. 460-461.

"A Logic Design Structure for LSI Testability" by E. B. Eichelberger et al., 14th Design Automation Conference Proceedings, Jun. 20, 21 & 22, 1977, New Orleans, La. IEEE Catalog No. 77, CH1216-1C, pp.462-468.

"Automatic Checking of Logic Design Structures for Compliance with Testability Ground Rules" by H. C. Godoy et al., 14th Design Automation Conference Proceedings, Jun. 20, 21 & 22, 1977, New Orleans, La. IEEE Catalog No. 77, CH1216-1C, pp. 469-478.

"Test Generation for Large Logic Networks" by P. S. Botoroff et al. 14th Design Automation Conference Proceedings, Jun. 20, 21 & 22, 1977, New Orleans, La. IEEE Catalog No. 77, CH1216-1C, pp. 479-485.

"Delay Test Generation" by E. P. Hsieh et al., 14th Design Automation Conference Proceedings, Jun. 20, 21 & 22, 1977, New Orleans, La., IEEE Catalog No. 77, CH1216-1C, pp. 486-491.

"Delay Test Simulation" by T. M. Storey et al., 14th Design Automation Conference Proceedings, Jun. 20, 21 & 22, 1977, New Orleans, La., IEEE Catalog No. 77, CH 1216-1C, pp. 492-494.

"Selective Controllability: L A Proposal for Testing and Diagnosis" by F. Hsu et al., 15th Design Automation Conference Proceedings, Jun. 19, 20 & 21, 1978, Las Vegas, Nevada, IEEE Catalog No. 78 CH 1363-1C, pp. 110-116.

"Testability Considerations in A VLSI Design Automation System" by E. H. Porter (Paper 2.3) 1980 IEEE Test Conference, CH1608-9/80/0000-0026.

"Automatic Test Generation Methods for Large Scale Integrated Logic" by E. R. Jones et al., IEEE Journal of Solid-State Circuits, vol. SC-2, No. 4, Dec. 1967, pp.221-226.

"Techniques for the Diagnosis of Switching Circuit

Failures", Proceedings of the 2nd Annual Symposium on Switching Theory and Logical Design, Oct. 1960, pp. 152–160 by J. M. Galey et al.
"Semiconductor Wafer Testing" by D. E. Shultis, IBM Technical Disclosure Bulletin, vol. 13, No. 7, Dec. 1970, p. 1793.
"Automatic System Level Test Generation and Fault Locator for Large Digital Systems" by A. Yamada et al., 15th Design Automation Conference Proceedings, Jun.19, 20 & 21, 1978, Las Vegas, Nevada, IEEE Catalog No. 78 CH 1363-1C, pp. 347–352.
"LSI Chip Design for Testability" by S. DasGupta et al., 1978 IEEE International Solid–State Circuits Conference, Digest of Technical Papers, Feb.1978, pp. 216–217.
"Design for Testability of the IBM System/38" by L. A. Stolte, Digest of Papers 1979 IEEE Test Conference (Oct. 23–25, 1979, Cherry Hill, New Jersey), pp. 29–36.
"Printed Circuit Card Incorporating Circuit Test Register" by E. I. Muehldorf, IBM Technical Disclosure Bulletin, vol. 16, No. 6, Nov. 1973, p. 1732.
"AC Chip In–Place Test" by M. T. McMahon, Jr., IBM Technical Disclosure Bulletin, vol. 17, No. 6, Nov. 1974, pp. 1607–1608.
"Shunting Technique for Testing Electronic Circuitry" by R. D. Harrod, IBM Technical Disclosure Bulletin, vol. 18, No. 1, Jun. 1975, pp. 204–205.
"Interconnection Test Arrangement" by J. D. Barnes, IBM Technical Disclosure Bulletin, vol. 22, No. 8B, Jan. 1980, pp. 3679–3680.
"Single Clock Shift Register Latch" by T. W. Williams, IBM Technical Disclosure Bulletin, vol. 16, No. 6, Nov. 1973, p. 1961.
"Trigger Arrays Using Shift Register Latches" by S. DasGupta, IBM Technical Disclosure Bulletin, vol. 24, No. 1B, Jun. 1981, pp. 615–616.
"Logic–Array Isolation by Testing" by P. Goel, IBM Technical Disclosure Bulletin, vol. 23, No. 7A, Dec.1980, pp. 2794–2799.

*Primary Examiner*—David H. Malzahn
*Attorney, Agent, or Firm*—Wesley DeBruin

[57] ABSTRACT

LSI circuitry conforming to LSSD rules and techniques usually requires at least a small portion of circuitry used only for check and test purposes. The disclosed circuitry meets the LSSD design rules and techniques and considerably reduces the test circuit overhead. The disclosure modifies the known shift register latch (SRL) strategy by replacing the SRL's by master latches in such a manner that the information contained in them is shifted in cascades, using the "division by two" principle for the master latches on the chip. The shift chain having only master latches is selected in response to shift clock signals. By consecutively shifting the respective cascade element, detailed information is obtained for all the master latches on the chip (without the information of the master latches temporarily used as slave latches during shifting) being lost in the cascade element. Level Sensitive Scan Design Rules and Techniques are extensively disclosed in the testing art. See for example: (1) U.S. Pat. No. 3,783,254 entitled "Level Sensitive Logic System" filed Oct. 16, 1972, granted Jan. 1, 1974 to E. B. Eichelberger, of common assignee herewith; or (2) "A Logic Design Structure for LSI Testability" by E. B. Eichelberger and T. W. Williams, 14th Design Ahtomation Conference Proceedings, pp. 462–468, June 20, 21 and 22, 1977, New Orleans, Louisiana, IEEE Catalog Number 77, CH1216-1C.

5 Claims, 5 Drawing Figures

SHIFT REGISTER LATCH CIRCUIT MEANS FOR CHECK AND TEST PURPOSES AND CONTAINED IN LSI CIRCUITRY CONFORMING TO LEVEL SENSITIVE SCAN DESIGN (LSSD) RULES AND TECHNIQUES

BACKGROUND OF THE INVENTION

1. Field of the Invention

The invention relates to shift register latch circuit means contained in LSI circuitry conforming to LSSD rules and techniques. The shift register latch circuit means is utilized for checking and testing the LSI circuitry.

2. Cross-Reference to Related Applications

1. U.S. patent application Ser. No. 066,130 entitled "Improved Level Sensitive Scan Design System", filed Aug. 13, 1979 by S. DasGupta et al., of common assignee granted as U.S. Pat. No. 4,293,919 on Oct. 6, 1981.

2. U.S. patent application Ser. No. 062,932 entitled "Method and Arrangement of Testing Sequential Circuits Represented by Monolithically Integrated Semiconductor Circuits", filed July 26, 1979 by J. Hajdu and G. Knauft, of common assignee granted as U.S. Pat. No. 4,298,980 on Nov. 3, 1981.

3. U.S. patent application Ser. No. 934,936 entitled "Module Interconnection Testing Scheme", filed Aug. 18, 1978 by S. J. Hong, of common assignee, granted as U.S. Pat. No. 4,241,307 on Dec. 23, 1980.

4. U.S. patent application Ser. No. 974,641 entitled "Chip and Wafer Configuration and Testing Method for Large-Scale-Integrated Circuits" filed Dec. 29, 1978 by F. F. Tsui, of common assignee, granted as U.S. Pat. No. 4,244,048 on Jan. 6, 1981.

5. U.S. patent application Ser. No. 929,480 entitled "Test Circuitry For Module Interconnection Network" filed July 31, 1978, by M. T. McMahon, Jr., of common assignee, granted as U.S. Pat. No. 4,220,917 on Sept. 2, 1980.

6. U.S. patent application Ser. No. 104,481 filed Dec. 17, 1979 entitled "Automatic Testing of Complex Semiconductor Components With Test Equipment Having Less Channels Than Those Required By The Component Under Test" by H. D. Schnurmann, of common assignee, granted as U.S. Pat. No. 4,348,759 on Sept. 7, 1982.

7. U.S. patent application Ser. No. 264,995 filed May 18, 1981 entitled "Shift Register Latch Circuit Means Contained in LSI Circuitry Conforming to Level Sensitive Scan Design (LSSD) Rules and Techniques and Utilized At Least in Part for Check and Test Purposes" by Arnold Blum and of common assignee.

As a result of increasing integration, and in particular large-scale integration (LSI) and very large scale integration (VLSI), the direct access to a circuit group in a physical unit (e.g., a chip, a module, etc.) has become increasingly difficult and restricted. This is attributable both to the considerable increase in the number of circuits used in the LSI and VLSI unit and to the microscopical dimensions such circuits have. Thus, the testing of such circuits has become one of the main problems during the manufacture of highly integrated circuits.

The testing of an LSI and VLSI unit is further aggravated by the presence of inaccessible storage elements and latch circuits which are generally embedded along with the logical combinational networks. As it is impossible to test and check the logical states of these embedded latches, it is equally impossible to test the appertaining logical networks. In spite of this, it is not possible to do without a reliable and thorough test of the various LSI and VLSI components and units during manufacturing and operation.

A number of U.S. Patents, briefly discussed below, concern a system design method and discipline (or rules and techniques) for meeting the above requirements. These rules and techniques all come under the title "LSSD" (Level-Sensitive Scanning Design). A feature all of the known solutions have in common is that a built-in circuit is required for each LSI unit, by means of which the logical state of the unit is explicitly tested in full and/or is tested at a limited number of I/O pins, using certain I/O methods. These requirements can be met by arranging for each latch of the logical system in the unit to be associated with shift register latches and by subsequently combining or organizing these shift register latches (SRLs) in the form of one or several shift register data channels, the I/O stages of which are accessible from the outside.

Detailed operation by means of this SRL arrangement (wherein each shift register latch comprises a master latch and a slave latch) for different test requirements are expressly set out and specified in U.S. Pat. No. 3,761,695, FIGS. 7 through 9 of U.S. Pat. No. 3,784,907 and a number of other U.S. patents and publications fully identified hereinafter.

The most important requirements may be summarized as follows: In the test mode, particular logical test patterns required, are serially entered and subsequently shifted to the appropriate latch positions if the unit is operated in the shift mode, i.e., by inhibiting the system clock and by triggering the shift clock pulse to the unit. As a result, the latch states of the individual circuits supply the pulses required for testing the appertaining logical networks. Then the test patterns are passed on through the networks by implementing one or several steps of the function mode, i.e., by normal system clock energization. The response patterns of the logical networks to the pulses applied are latched by the system latches in a known manner as a function of particular states in the design of the system, which often replace the test patterns originally entered. For testing, the system returns to the shift mode, issuing the response patterns. By means of the conventional shift registers, which are generally used in practice for SRLs, it is possible to check and test at the expense of the hardware, which in certain cases may be rather uneconomical. This is largely due to the fact that to each system latch a second latch has to be added, permitting the former to function as an SRL circuit. Namely, each SRL is comprised of a master latch and a slave latch.

In view of this, conventional shift registers use two latches (a master and a slave) for each shift register latch (SRL) stage. Shifting in and shifting out operations are effected by the parallel application of a two-phase clock sequence. (For example, an A-clock and a B-clock are provided).

The shift register featured in U.S. Pat. No. 3,783,254 uses two DC latch circuits (a master latch circuit and a slave latch circuit) for each shift register latch stage. Shifting in and shifting out is effected by a two-phase clock system (A-clock and B-clock) which is applied in parallel to a first and a second latch circuit (master and slave) of each stage of the shift register.

To reduce the expenditure incurred by the double latch circuits, GE-OS No. 2 723 594 proposes a shift register for check and test purposes which, while having the same function as known registers, necessitates only half as many latch circuits. [GE OS No. 2723594 corresponds to U.S. Pat. No. 4,051,353 entitled "Accordion Shift Register and Its Application In the Implementation of Level Sensitive Logic System" granted Sept. 27, 1977 to Hua-Tung Lee and of common assignee herewith]. For this purpose, a latch circuit is associated with each circuit or each circuit group for a particular logical function or storage function. The latch circuits forming states of the shift register, to the input of which check and test information is applied. At the output of the shift register particular bit patterns are emitted as a function of the check and test information entered as well as of the state of the integrated circuit to be tested. As a function of a shift clock control, A- and B-pulses alternately increment the latch circuits in a shift register forming a test channel. This activates the different latch circuits at a clock time (A or B) either once or several times. As a result, the information in the shift register is compressed and the decompressed, i.e., pulled apart in the manner of an accordion.

The solution, set forth in U.S. Pat. No. 4,051,353, uses a relatively high proportion of slave circuits, namely fifty percent in relation to the master circuits. In addition, its line structure and control are extensive.

Background Art

The following patents and publications are directed to the testing of electronic structures. A number of these patents and publications further disclose LSSD testing arrangements and organizations. It is to be appreciated, with reference to the subject invention, that the following art is not submitted to be the only prior art, the best prior art, or the most pertinent prior art.

Patents

U.S. Pat. No. 4,071,902 entitled "Reduced Overhead for Gated B Clock Testing" granted Jan. 31, 1978 to E. B. Eichelberger and T. W. Williams and of common assignee.

U.S. Pat. No. 4,051,353 (Ser. No. 701,055) entitled "Implementation of Level Sensitive Logic System Employing Accordion Shift Register Means" granted Sept. 27, 1977 to Hua-Tung Lee and of common assignee herewith.

U.S. Pat. No. 3,961,252 (Ser. No. 534,606) entitled "Testing Embedded Arrays" granted June 1, 1976 to E. B. Eichelberger and of common assignee herewith.

U.S. Pat. No. 3,961,254 (Ser. No. 534,608) entitled "Testing Embedded Arrays" granted June 1, 1976 to J. R. Cavaliere et al. and of common assignee herewith.

U.S. Pat. No. 3,961,251 (Ser. No. 534,605) entitled "Testing Embedded Arrays" granted June 1, 1976 to W. P. Hurley et al., and of common assignee herewith.

U.S. Pat. No. 4,063,080 entitled "Method of Propagation Delay Testing A Level Sensitive Embedded Array Logic System", filed June 30, 1976, granted Dec. 13, 1977 to E. B. Eichelberger, E. I. Muehldorf, R. G. Walther and T. W. Williams and of common assignee.

U.S. Pat. No. 4,051,352 entitled "Level Sensitive Embedded Array Logic System", filed June 30, 1976, granted Sept. 27, 1977 to E. B. Eichelberger, E. I. Muehldorf, R. G. Walther and T. W. Williams and of common assignee.

U.S. Pat. No. 3,789,205 entitled "Method of Testing MOSFET Planar Boards" granted Jan. 29, 1974 to R. L. James and of common assignee.

U.S. Pat. No. 4,006,492 entitled "High Density Semiconductor Chip Organization" filed June 23, 1975, granted Feb. 1, 1977 to E. B. Eichelberger amd G. J. Robbins and of common assignee.

U.S. Pat. No. 4,063,078 entitled "Clock Generation Network" filed June 30, 1976 granted Dec. 13, 1977 to E. B. Eichelberger and S. Das Gupta and of common assignee.

U.S. Pat. No. 3,783,254 entitled "Level Sensitive Logic System" filed Oct. 16, 1972, granted Jan. 1, 1974 to E. B. Eichelberger and of common assignee.

U.S. Pat. No. 3,761,695 entitled "Method of Level Sensitive Testing A Functional Logic System" filed Oct. 16, 1972, granted Sept. 25, 1973 to E. B. Eichelberger and of common assignee.

U.S. Pat. No. 3,784,907 entitled "Method of Propagation Delay Testing A Functional Logic System" filed Oct. 16, 1972 granted Jan. 8, 1974 to E. B. Eichelberger and of common assignee.

U.S. Pat. No. 3,746,973 entitled "Testing of Metallization Network on Insulative Substrates Supporting Semiconductor Chips" granted July 17, 1973 to M. T. McMahon, Jr., and of common assignee.

U.S. Pat. No. 3,781,683 entitled "Test Circuit Configuration For Integrated Semiconductor Circuits and a Test System Containing Said Configuration" granted Dec. 25, 1973 to L. E. Freed and of common assignee.

U.S. Pat. No. 3,803,483 entitled "Semiconductor Structure For Testing of Metallization Networks on Insulative Substrates Supporting Semiconductor Chips" granted Apr. 9, 1974 to M. T. McMahon, Jr. and of common assignee.

U.S. Pat. No. 3,815,025 entitled "Large-Scale Integrated Circuit Testing Structure" granted June 4, 1974 to P. V. Jordan and of common assignee.

U.S. Pat. No. 4,055,754 entitled "Memory Device and Method of Testing the Same" granted Oct. 25, 1977 to G. D. Chesley.

U.S. Pat. No. 4,225,957 entitled "Testing Macros Embedded in LSI Chips' granted Sept. 30, 1980 to C. R. Doty, Jr., et al., and of common assignee.

U.S. Pat. No. 4,140,967 entitled "Merged Array PLA Device, Circuit, Fabrication Method and Testing Technique" granted Feb. 20, 1979 to P. S. Balasubramanian et al., and of common assignee.

U.S. Pat. No. 4,220,917 entitled "Test Circuitry For Module Interconnection Network" granted Sept. 2, 1980 to M. T. McMahon, Jr., and of common assignee.

U.S. Pat. No. 4,074,851 entitled "Method of Level Sensitive Testing A Functional Logic System with Embedded Array" granted Feb. 21, 1978 to E. B. Eichelberger and of common assignee.

U.S. Pat. No. 3,806,891 entitled "Logic Circuit For SCAN-IN/SCAN-OUT" granted Apr. 23, 1974 to E. B. Eichelberger et al., and of common assignee.

U.S. Pat. No. 4,244,048 entitled "Chip and Wafer Configuration and Testing Method for Large-Scale-Integrated Circuits" granted Jan. 6, 1981 to F. F. Tsui and of common assignee.

Publications

"Introduction to An LSI Test System" by M. Correia and F. B. Petrini, 14th Design Automation Conference Proceedings, June 20, 21 and 22, 1977, New Orleans, La., IEEE Catalog Number 77, CH 1216-1C, pages 460-1.

"A Logic Design Structure For LSI Testability" by E. B. Eichelberger and T. W. Williams, 14th Design Automation Conference Proceedings, June 20, 21 and 22, 1977, New Orleans, La., IEEE Catalog Number 77, CH 1216-1C, pages 462-8.

"Automatic Checking of Logic Design Structures For Compliance with Testability Ground Rules" by H. C. Godoy, G. B. Franklin and P. S. Bottoroff, 14th Design Automation Conference Proceedings, June 20, 21 and 22, 1977, New Orleans, La., IEEE Catalog Number 77, CH 1216-1C, pages 469-478.

"Test Generation For Large Logic Networks" by P. S. Botoroff, R. E. France, N. H. Garges and E. J. Orosz, 14th Design Automation Conference Proceedings, June 20, 21 and 22, 1977, New Orleans, La., IEEE Catalog Number 77, CH 1216-1C, pages 479 to 485.

"Delay Test Generation" by E. P. Hsieh, R. A. Rasmussen, L. J. Vidunas and W. T. Davis, 14th Design Automation Conference Proceedings, June 20, 21 and 22, 1977, New Orleans, La., IEEE Catalog Number 77, CH 1216-1C, pages 486 to 491.

"Delay Test Simulation" by T. M. Storey and J. W. Barry, 14th Design Automation Conference Proceedings, June 20, 21 and 22, 1977, New Orleans, La., IEEE Catalog Number 77, CH 1216-1C, pages 492 to 494.

"Selective Controllability: A Proposal For Testing and Diagnosis" by F. Hsu, P. Solecky and L. Zobniw, 15th Design Automation Conference Proceedings, June 19, 20 and 21, 1978, Las Vegas, Nev., IEEE Catalog Number 78 CH 1363-1C, pages 110-116.

"Testability considerations in A VLSI Design Automation System" by E. H. Porter (Paper 2.3) 1980 IEEE Test Conference, CH 1608-9/80/0000-0026.

"Automatic Test Generation Methods For Large Scale Integrated Logic" by E. R. Jones and C. H. Mauys, IEEE Journal of Solid-State Circuits, Vol. SC-2, No. 4, December 1967, pages 221-226.

"Techniques For The Diagnosis of Switching Circuit Failures", Proceedings of the 2nd Annual Symposium on Switching Theory and Logical Design, October 1960, pages 152-160.

"Semiconductor Wafer Testing" by D. E. Shultis, IBM technical Disclosure Bulletin, Vol. 13, No. 7, December 1970, page 1793.

"Automatic System Level Test Generation and Fault Locator For Large Digital Systems" by A. Yamada et al., 15th Design Automation Conference Proceedings, June 19, 20 and 21, 1978, Las Vegas, Nev., IEEE Catalog Number 78 CH 1363-1C, pages 347-352.

"LSI Chip Design for Testability" by S. Das Gupta et al., 1978 IEEE International Solid-State Circuits Conference, Digest of Technical Papers February 1978, pages 216 and 217.

"Design For Testability of the IBM System/38" by L. A. Stolte, Digest of Papers 1979 IEEE Test Conference (Oct. 23-25, 1979, Cherry Hill, N.J.) pages 29-36.

"Printed Circuit Card Incorporating Circuit Test Register" by E. I. Muehldorf, IBM Technical Disclosure Bulletin, Vol. 16, No. 6, November 1973, page 1732.

"AC Chip In-Place Test" by M. T. McMahon, Jr., IBM Technical Disclosure Bulletin, Vol. 17, No. 6, November 1974, pages 1607-08.

"Shunting Technique For Testing Electronic Circuitry" by R. D. Harrod, IBM Technical Disclosure Bulletin, Vol. 18, No. 1, June 1975, pages 204-05.

"Interconnection Test Arrangement" by J. D. Barnes, IBM Technical Disclosure Bulletin, Vol. 22, No. 8B, January 1980, pages 3679-80.

"Single Clock Shift Register Latch" by T. W. Williams, IBM Technical Disclosure Bulletin, Vol. 16, No. 6, November 1973, page 1961.

Trigger Arrays Using Shift Register Latches by S. Das Gupta, "IBM Technical Disclosure Bulletin", Vol. 24, No. 1B, June 1981, pages 615-616.

"Logic-Array Isolation by Testing" by P. Goel, IBM Technical Disclosure Bulletin, Vol. 23, No. 7A, December 1980, pages 2794-2799.

SUMMARY OF THE INVENTION

Therefore, it is an object of the invention to provide a shift register for check and test purposes on storage and logic chips which, in spite of information buffering, can be used without slave circuits and which has a simpler line structure than previously used registers.

The solution, in accordance with the invention, may be summarized as set forth in the following numbered paragraphs.

No. 1. Shift register latch circuit means comprised of latch circuits and contained on an integrated circuit logic and/or storage chip for check and test purposes, the stored contents of said shift register latch circuit means being shifted by clock pulses, said shift register latch circuit means being characterized in that the latch circuits (MLT) are connected in the form of cascaded shift chains (I, to n), that the first shift chain (I) comprises all the latch circuits (MLT1 to MLT8) forming a complete shift register, that the second shift chain (II) comprises only every other latch circuit (MLT2, MLT4, MLT6, . . . ), and that the last shift chain comprises only two latch circuits (MLT4 and MLT8).

No. 2. Shift register latch circuit means in accordance with numbered paragraph No. 1 (supra) further characterized in that the latch circuits (MLT) belonging to a chain as well as the appertaining shift clock pulses (CL1 and/or CL2) are selected by means of a connected logic circuit (00, 01, 10) and driver circuits by applying control signals (test gate 0 and test gate 1) to the inputs of said logic circuit and by the outputs of said circuits being connected to selected ones of the latch circuits (MTL).

No. 3. Shift register latch circuit means in accordance with numbered paragraphs 1 or 2 (supra) further characterized in that the inputs of the master latch circuits (MLT1 to MLT8) are preceded by AND circuits which by being connected to the respective lines receive functional clock signals and functional data bits, in addition to said control signals.

No. 4. Shift register latch circuit means in accordance with numbered paragraphs 1, 2 or 3 (supra) further characterized in that only one shift clock (CL1 or CL2) becomes active via said logic circuit and driver circuits by only the outputs of said driver circuit which are associated with the even- or odd-numbered clock becoming active.

No. 5. Shift register latch circuit means in accordance with numbered paragraphs 1, 2 or 3 (supra) further characterized in that a latch circuit (MLT) serving as a master latch circuit (e.g., MLT4) is a physical slave latch circuit for a particular selected time for the second shift chain of the shift register latch circuit means.

The cascading of the master latch circuits MLT and the use of one of these master latch circuits in the first partial cascade as a slave latch circuit, permits utilizing the master latch circuits which become idle as slave latch circuits. This permits the buffering of information, i.e., the shifting of data in a shift chain thus designed, without a slave latch circuit being actually present and without having to do away with buffering. As a result, no critical time requirements have to be observed for the control pulses and there are no expensive circuits for controlling the shift register. This eliminates the various slave latch circuits otherwise required, as well as the connections between said slave latch circuits and the connecting lines to the master latch circuits. This is accomplished without impairing the function in any way or without stringent requirements having to be observed with regard to time and circuits.

BRIEF DESCRIPTION OF THE DRAWINGS

The invention will be described in detail below with reference to the drawings.

PREFERRED EMBODIMENT

Figure 1:
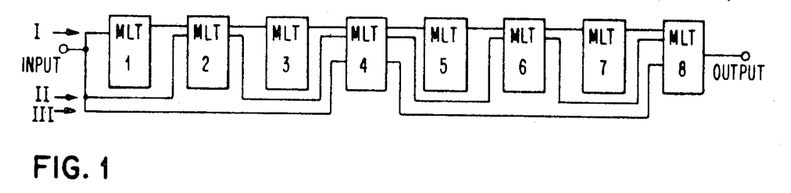
FIG. 1 is a block diagram of shift register latch circuit means in accordance with the invention.

FIG. 1 shows a shift register latch circuit means, in accordance with the invention which may be part of a large shift register latch circuit means for the data flow in a processor unit. For clarity's sake, all clock signals and the lines carrying them have been omitted in this basic circuit diagram.

The shift register latch circuit means illustrated in FIG. 1 has eight master latch circuits MLT1 to MLT8 without any slave latch circuits, as are required for known shift registers. For this purpose, the master latch circuits MLT are cascaded in the form of shift chains in such a manner that the shift chain I comprises all master latch circuits, the shift chain II comprises only every other master latch circuit MLT, and the shift chain III comprises every fourth master latch circuit, etc., until the last shift chain n comprises only two master latch circuits MLT. In the first cascade, the master latch circuit MLT 4 functions as a master and a slave latch circuit for shifting the cascades I and II. It also serves as a master latch circuit for shifting cascade III. It is technically feasible to actually provide an additional slave latch at this point.

Although the individual clock signals and clock lines are not shown in FIG. 1, it is to be appreciated that the individual shift chains I to III are in each case individually controlled, i.e., the information contained in them is individually shifted during the shift time intervals associated with them.

Figure 2:
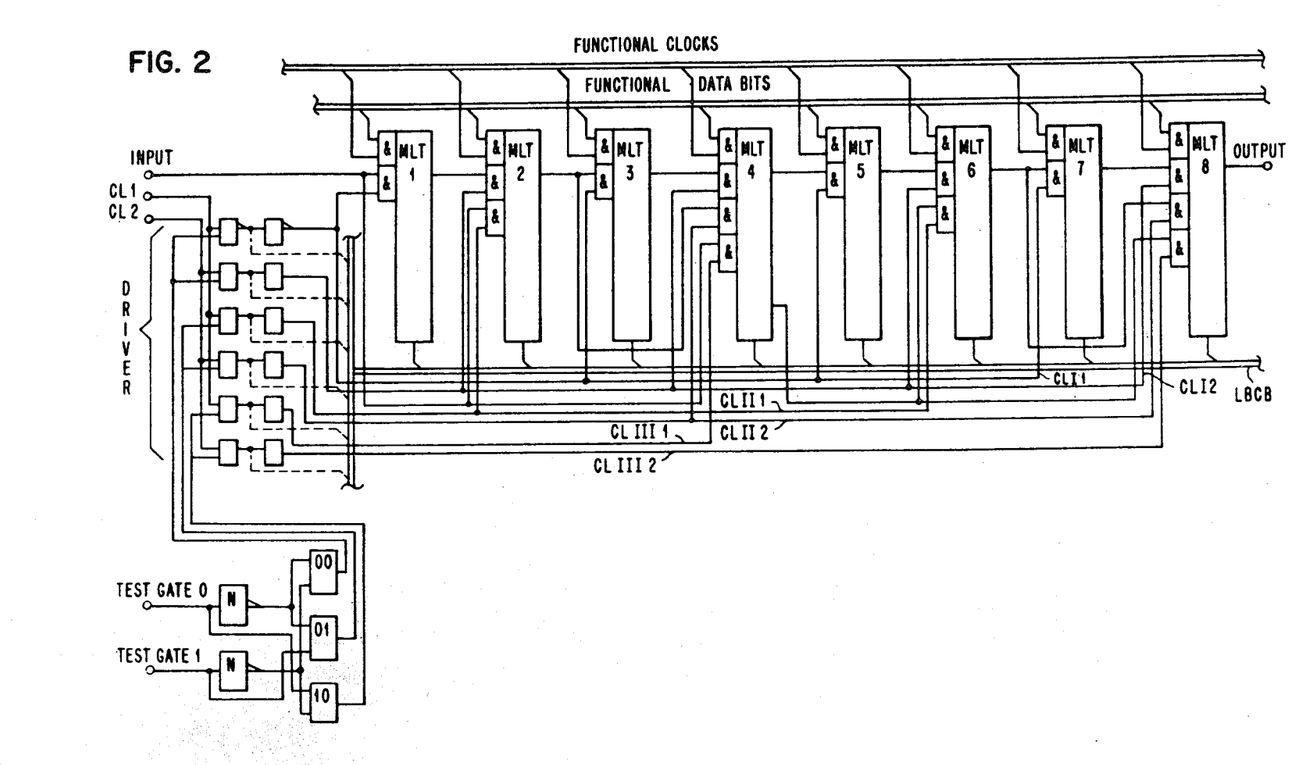
FIG. 2 is a detailed circuit of shift register latch circuit means in accordance with the invention.

FIG. 2 shows in greater detail the shift register latch circuit means in accordance with FIG. 1. The shift register latch circuit means has eight master latch circuits MLT 1 through MLT8 (as in FIG. 1) with the appertaining shift logic, i.e., the clock lines and the appertaining circuits. As may be seen from FIG. 2, each master latch circuit MLT has a separate shift data input for each shift chain with which it is associated. The input is formed by AND circuits preceding each master latch circuit. In addition to these shift data inputs for the associated shift chains, the purely functional data inputs are connected to AND circuits preceding the master latch circuits MLT.

It is also to be appreciated that in the shift register latch circuit means of FIG. 2, the left-most master latch circuit MLT1 forms the shift input of the whole register, whereas the right-most latch circuit MLT8 forms the output of the whole shift register.

On the left at the bottom of the circuit diagram in accordance with FIG. 2 the input signals, test gate 0 and test gate 1, are applied to a network for determining which of the shift chains I, II or III is to be controlled for shifting the data stored therein. In the circuit including two inverters N and connected logical circuits 00, 01 and 10, the two binarily coded signals, test gate 0 and test gate 1 on the appropriate lines, are logically combined in such a manner that the output signals of the latter circuits select the shift chain I in the case of the combination 00, the shift chain II in the case of the combination 01, and the shift chain III in the case of the combination 10. For this purpose, the outputs of logical circuits 00, 01 and 10 are connected to the inputs of driver circuits. The driver circuits also receive as inputs the clock pulses CL1 and CL2. This means that, via the driver circuits, the clock signals CL1 and CL2 reach only particular master latch circuits MLT of one of the shift chains I, II or III at particular time intervals, thus forming the individual partial cascades and shift chains I to III, respectively.

It is important that during a shift operation in each shift chain I, II or III the odd master latch circuits are defined as shift master latches and are set by the shift clock CL . . . 1, whereas the even-numbered master latch circuits are treated as slave shift latch circuits and are triggered by means of the shift clock CL . . . 2. In spite of the fact that there is no physical slave latch circuit, this system is such that the shift register latch circuit means illustrated in FIG. 2 fully meets the criteria of a standard shift register, i.e., that at the time of shifting a slave latch circuit is available for the information to be shifted, so that the latter can be actally buffered.

Figure 3:
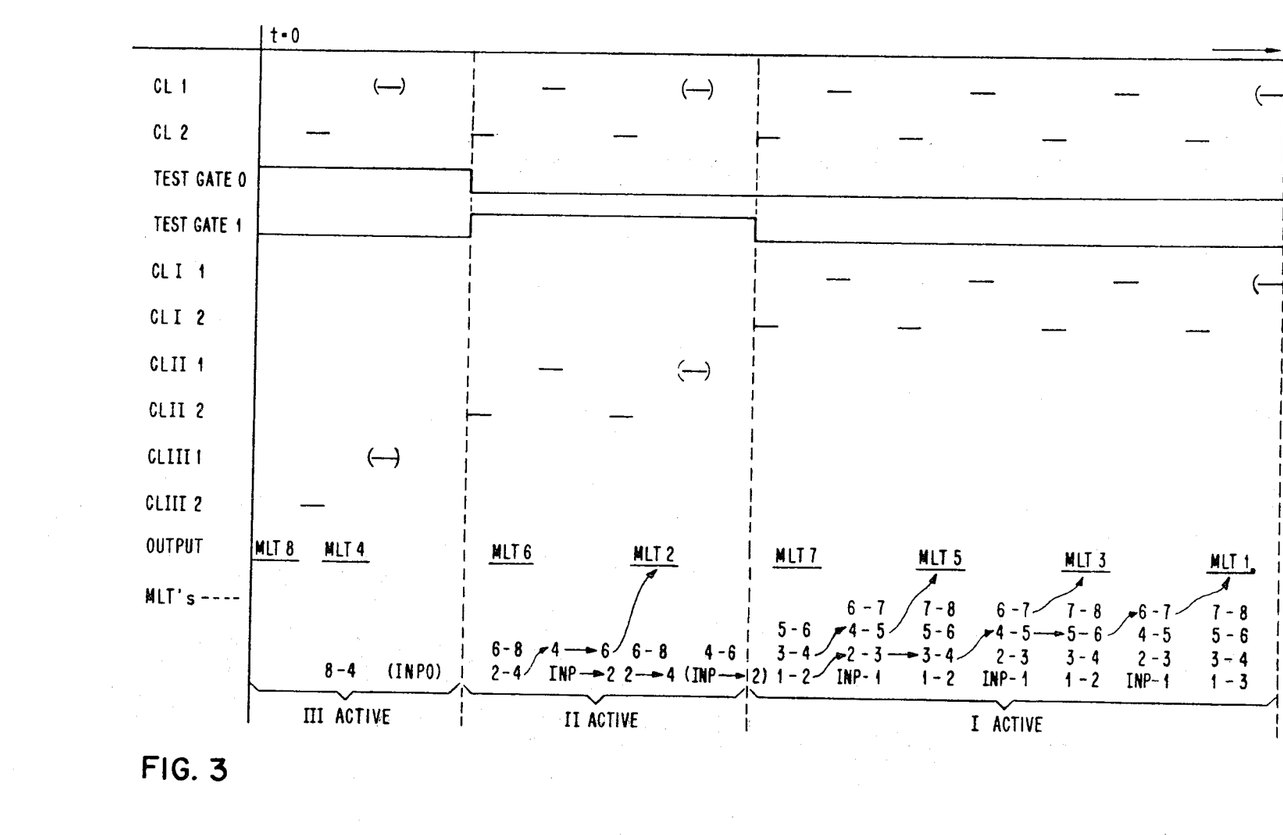
FIG. 3 is a time diagram for the input operation of the test shift register latch circuit means in accordance with FIG. 2.
Figure 4:
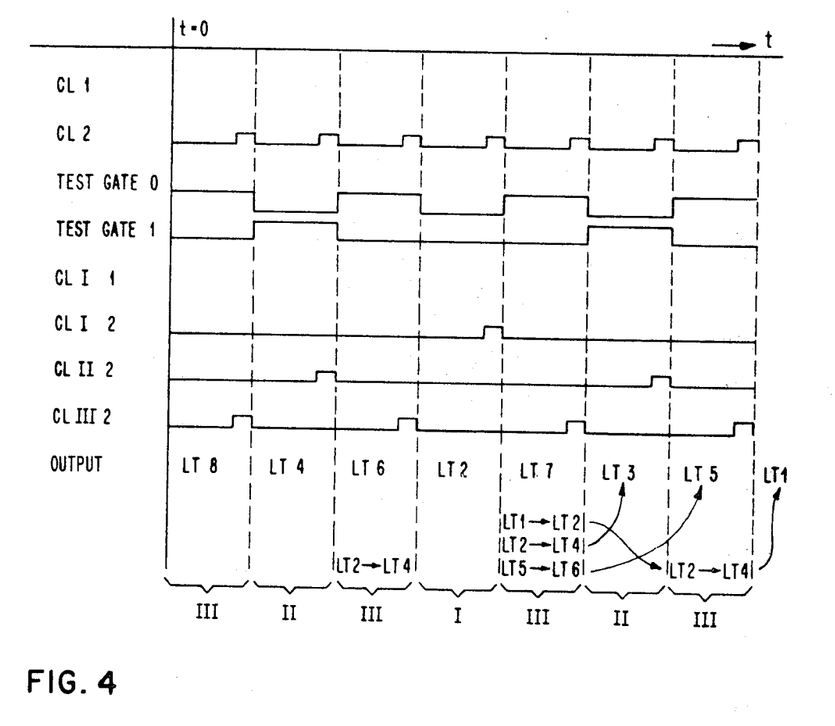
FIG. 4 is a time diagram for the shift output operation of the test shift register latch circuit means in accordance with FIG. 2.

FIG. 3 shows a time and pulse diagram for shifting information out of all the eight illustrated master latch circuits MLT1 to MLT8 of the shift register latch circuit means in accordance with FIG. 2. As may be seen, the state of the signals, test gate 0 and test gate 1, determines the shift time intervals of the respective shift chains I to III. For the two symmetrical shift clocks CL1 and CL2 the contents of the various master latch circuits present in the data flow register appear in the specified order at the output of the shift register latch circuit means. The bottom-most part of the time diagram in accordance with FIG. 3 shows the respective states of the master latch circuits in the respective shift claims I to III. FIG. 4 shows a pulse and time diagram permitting faster shifting by means of the shift register latch circuit means in accordance with FIG. 2. In the case of this time and pulse pattern only the shift clock CL2 is active. The master latch circuits MLT1 to MLT8 belonging to the individual shift chains I to III are activated in another order by means of the signals test gate 0 and test gate 1. With this method, even the information of the odd-numbered master latch circuits MLT1, MLT3, . . . is maintained when information is shifted out of the shift register latch circuit means, i.e., the information stored in said circuits does not get lost.

The simultaneous entry of new information into the shift register latch circuit means is avoided because there is no shift clock CL1. It is to be appreciated that this characteristic can also be used to great advantage for diagnositc purposes in data processing systems. In addition, the number of shift clocks CL is halved by this method.

Figure 5:
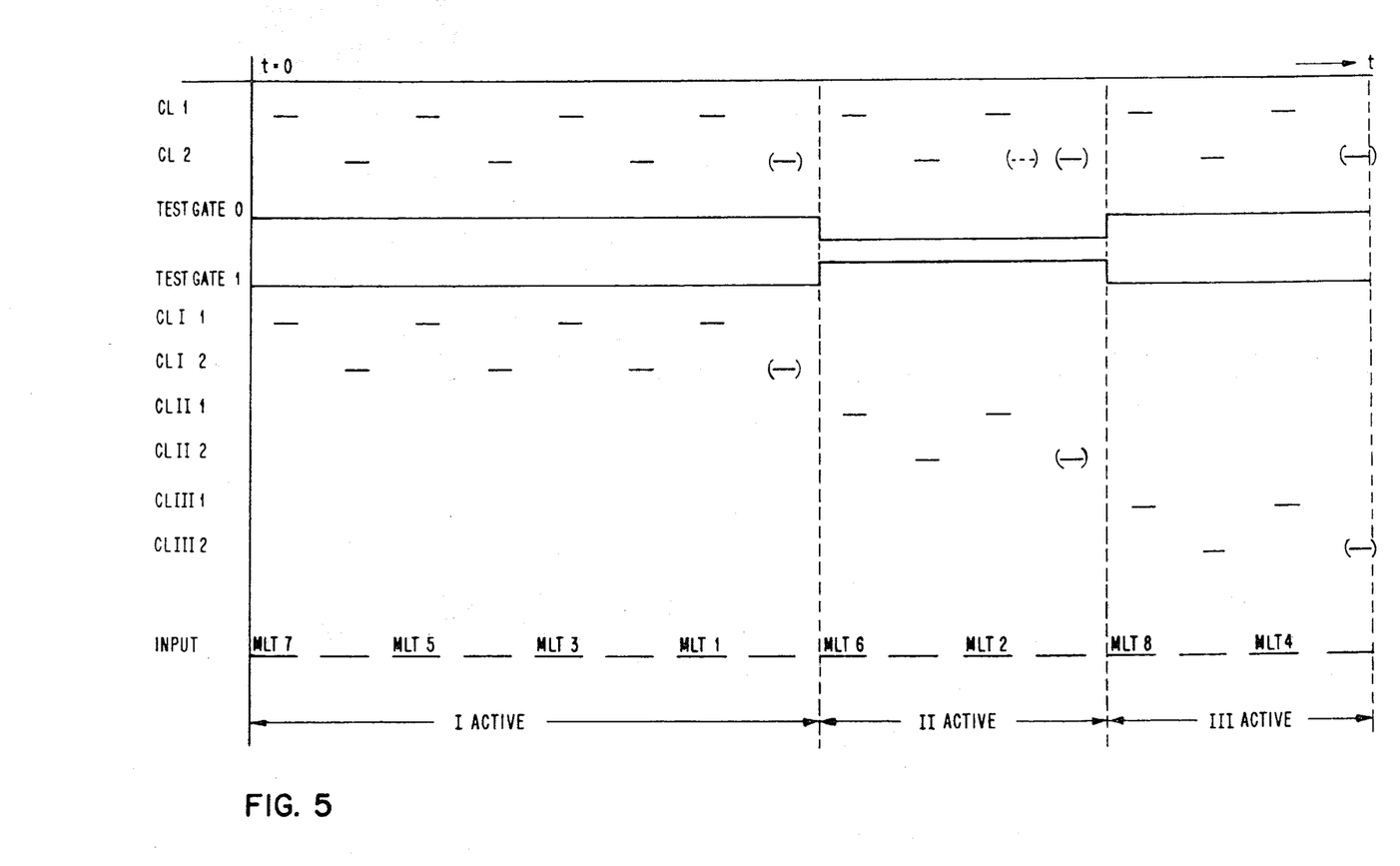
FIG. 5 is a time diagram for a second version of the output operation of the test shift register latch circuit means in accordance with FIG. 2.

FIG. 5 shows a further time and pulse diagram for entry into the various data flow register master latch circuits, with the two shift clocks CL1 and CL2 being symmetrical. The values to be entered into the respective master latch circuits are applied to the input in the specified order. As a function of the corresponding shift signals CL . . . 1 and CL . . . 2 passed, the control signals test gate 0 and test gate 1 again determine which shift chain is active, I, II and III. [. . . standing for the dots, depending upon the structure of the shift register].

As shown, this solution halves the number of latch circuits required in a shift register latch circuit means. This saves space on the semiconductor chip which can be used advantageously for storage circuits and/or logical circuits fabricated on the chip. This is particularly advantageous if a complete microprocessor is to be fabricated on a chip, since in such a case the space available is extremely limited. The test functions and times are not curtailed by this concept, so that a semiconductor chip and the whole system, respectively, can still be fully checked and tested.

A further advantageous embodiment of the illustrated shift chain cascade circuit is obtained if the respective functional unit, for example, a processor, already comprises corresponding latch circuits for other functional time decoupling reasons. If, for example, the output is connected to the input of two successive latch circuits without logical circuits by only one line, said circuits may be used as a chain of the shift chain cascade, thus reducing the number of cascades considerably.

While the invention has been particularly shown and described with reference to the preferred embodiments thereof, it will be understood by those skilled in the art that various changes in form and detail may be made therein without departing from the spirit and scope of the invention.

I claim:

1. In a functional logic unit for performing at least one logical function, said functional logic unit including:

$2^n$ bistable latch circuits where n is a positive integer equal to two or greater in magnitude and each said bistable latch circuit has an input and an output;

connection means for connecting said $2^n$ bistable latch circuits into n independently operable cascade shift chains, each of said n cascade shift chains having an input and an output and wherein said first independently operable cascade shift chain includes each of said $2^n$ bistable latch circuits, said second independently operable cascade shift chain includes $2^{n-1}$ of said $2^n$ bistable latch circuits, said third independently operable cascade shift chain includes $2^{n-2}$ bistable latch circuits of said $2^n$ bistable latch circuits, said fourth independently operable cascade shift chain includes $2^{n-3}$ of said $2^n$ bistable latch circuits—and so on—and said last independently operable cascade shift chain includes two ($2^1$) bistable latch circuits of said $2^n$ bistable latch circuits;

and control means connected to each of said $2^n$ bistable latch circuits for independently controlling the shifting of data into, within and out of each of said n independently operable cascade shift chains.

2. In a functional logic unit for performing at least one logical function, as recited in claim 1 wherein n equals 3 and said $2^3$ latch circuits consist of latch circuits MLT1, MLT2, MLT3, MLT4, MLT5, MLT6, MLT7 and MLT8, said first independently operable cascade shift chain includes each of said $2^3$ latch circuits, said second independently operable cascade shift chain includes said latch circuits MLT2, MLT4, MLT6 and MLT8, and said last (nth) independently operable cascade shift register includes said latch circuits MLT4 and MLT8.

3. In an integrated circuit structure for performing a useful function, said integrated circuit structure including circuitry utilizable at least in part for electrically testing and checking said integrated circuit structure, said integrated circuit structure comprising:

first, second, third, fourth, fifth, sixth, seventh, and eighth bistable latch circuits, each of said bistable latch circuits having an input and an output;

a functional data bit source;

a functional clock source;

a first AND circuit having a first input connected to said functional data bit source, a second input connected to said functional clock source and an output connected to said input of said first bistable latch circuit;

a second AND circuit having a first input, a second input and an output connected to said input of said first bistable latch circuit;

a third AND circuit having a first input connected to said functional data bit source, a second input connected to said functional clock source and an output connected to the input of said second bistable latch circuit;

a fourth AND circuit having a first input connected to said output of said first bistable latch circuit, a second input and an output connected to said input of said second bistable latch circuit;

a fifth AND circuit having a first input, a second input and an output connected to said input of said second bistable latch circuit;

a sixth AND circuit having a first input connected to said functional data bit source, a second input connected to said functional clock source and an output connected to said input of said third bistable latch circuit;

a seventh AND circuit having a first input connected to said output of said second bistable latch circuit, a second input and an output connected to said input of said third bistable latch circuit;

an eighth AND circuit having a first input connected to said functional data bit source, a second input connected to said functional clock source and an output connected to said input of said fourth bistable latch circuit;

a ninth AND circuit having a first input connected to said output of said third bistable latch circuit, a second input and an output connected to said input of said fourth bistable latch circuit;

a tenth AND circuit having a first input connected to said output of said second bistable latch circuit, a second input and an output connected to said input of said fourth bistable latch circuit;

an eleventh AND circuit having a first input, a second input and an output connected to said input of said fourth bistable circuit;

a twelfth AND circuit having a first input connected to said functional data bit source, a second input connected to said functional clock source and an output connected to said input of said fifth bistable latch circuit;

a thirteenth AND circuit having a first input connected to said output of said fourth bistable latch circuit, a second input and an output connected to said input of said fifth bistable latch circuit;

a fourteenth AND circuit having a first input connected to said functional data bit source, a second input connected to said functional clock source and an output connected to said input of said sixth bistable latch circuit;

a fifteenth AND circuit having a first input connected to the output of said fifth bistable latch circuit, a second input and an output connected to the input of said sixth bistable latch circuit;

a sixteenth AND circuit having a first input connected to said output of said fourth bistable latch circuit, a second input and an output connected to said input of said sixth bistable latch circuit;

a seventeenth AND circuit having a first input connected to said functional data bit source, a second input connected to said functional clock source and an output connected to said input of said seventh bistable latch circuit;

an eighteenth AND circuit having a first input connected to said output of said sixth bistable latch circuit, a second input and an output connected to said input of said seventh bistable latch circuit;

a nineteenth AND circuit having a first input connected to said functional data bit source, a second input connected to said functional clock source and an output connected to the input of said eighth bistable latch circuit;

a twentieth AND circuit having a first input connected to said output of said seventh bistable latch circuit, a second input, and an output connected to the input of said eighth bistable latch circuit;

a twenty-first AND circuit having a first input connected to said output of said sixth bistable latch circuit, a second input and an output connected to said input of said eighth bistable latch circuit;

a twenty-second AND circuit having a first input connected to said output of said fourth bistable latch circuit, a second input and an output connected to said input of said eighth bistable latch circuit;

a first source of clock pulses;
a second source of clock pulses;
a first source of binary test signals;
a second source of binary test signals;
a first INVERTER circuit having an input connected to said first source of binary test signals and an output;

a second INVERTER circuit having an input connected to said second source of binary test signals and an output;

a twenty-third AND circuit having a first input connected to the output of said first INVERTER circuit a second input connected to the output of said second INVERTER circuit and an output;

a twenty-fourth AND circuit having a first input connected to said output of said first INVERTER circuit, a second input connected to said second source of binary test signals and an output;

a twenty-fifth AND circuit having a first input connected to said first source of binary test signals and a second input connected to said output of said second INVERTER circuit and an output;

a twenty-sixth AND circuit having a first input connected to said first clock source, a second input connected to said output of said twenty-third AND circuit and an output connected in common to said second input of said second AND circuit, said second input of said seventh AND circuit, said second input of said thirteenth AND circuit and said second input of said eighteenth AND circuit;

a twenty-seventh AND circuit having a first input connected to said second source of clock pulses, a second input connected to said output of said twenty-third AND circuit and an output connected in common to said second input of said fourth AND circuit, said second input of said ninth AND circuit, said second input of said fifteenth AND circuit and said second input of said twentieth AND circuit;

a twenty-eighth AND circuit having a first input connected to said first clock source, a second input connected to said output of said twenty-fourth AND circuit and an output connected in common to said second input of said fifth AND circuit and said second input of said sixteenth AND circuit;

a twenty-ninth AND circuit having a first input connected to said second clock source, a second input connected to said output of said twenty-fourth AND circuit and an output connected in common to said second input of said tenth AND circuit and said second input of said twenty-first AND circuit;

a thirtieth AND circuit having a first input connected to said first clock source, a second input connected to said output of said twenty-fifth AND circuit and an output connected to said second input of said eleventh AND circuit;

a thirty-first AND circuit having a first input connected to said second clock source, a second input connected to said output of said twenty-fifth AND circuit an an output connected to said second input of said twenty-second AND circuit;

an input terminal connected in common to said first input of said second AND circuit, said first input of said fifth AND circuit and said first input of said eleventh AND circuit; and an output terminal connected to said output of said eighth bistable latch circuit.

4. In an integrated circuit structure for performing a useful function, said integrated circuit structure including circuitry utilizable at least in part for electrically testing and checking said integrated circuit structure, said integrated circuit structure comprising:

first, second, third, fourth, fifth, sixth, seventh and eighth bistable latch circuits, each of said bistable latch circuits having an input and an output;

a first AND circuit having a first input, a second input and an output connected to said input of said first bistable latch circuit;

a second AND circuit having a first input connected to said output of said first bistable latch circuit, a second input and an output connected to said input of said second bistable latch circuit;

a third AND circuit having a first input, a second input and an output connected to said input of said second bistable latch circuit;

a fourth AND circuit having a first input connected to said output of said second bistable latch circuit, a second input and an output connected to said input of said third bistable latch circuit;

a fifth AND circuit having a first input connected to said output of said third bistable latch circuit, a second input and an output connected to said input of said fourth bistable latch circuit;

a sixth AND circuit having a first input connected to said output of said second bistable latch circuit, a second input and an output connected to said input of said fourth bistable latch circuit;

a seventh AND circuit having a first input, a second input and an output connected to said input of said fourth bistable latch circuit;

an eighth AND circuit having a first input connected to said output of said fourth bistable latch circuit, a second input and an output connected to said input of said fifth bistable latch circuit;

a ninth AND circuit having a first input connected to the output of said fifth bistable latch circuit, a second input and an output connected to the input of said sixth bistable latch circuit;

a tenth AND circuit having a first input connected to said output of said fourth bistable latch circuit, a second input and an output connected to said input of said sixth bistable latch circuit;

an eleventh AND circuit having a first input connected to said output of said sixth bistable latch circuit, a second input and an output connected to said input of said seventh bistable latch circuit;

a twelfth AND circuit having a first input connected to said output of said seventh bistable latch circuit, a second input, and an output connected to the input of said eighth bistable latch circuit;

a thirteenth AND circuit having a first input connected to said output of said sixth bistable latch circuit, a second input and an output connected to said input of said eighth bistable latch circuit;

a fourteenth AND circuit having a first input connected to said output of said fourth bistable latch circuit, a second input and an output connected to said input of said eighth bistable latch circuit;

a first source of clock pulses;

a second source of clock pulses;

a first source of binary test signals;

a second source of binary test signals;

a first INVERTER circuit having an input connected to said first source of binary test signals and an output;

a second INVERTER circuit having an input connected to said second source of binary test signals and an output;

a fifteenth AND circuit having a first input connected to the output of said first INVERTER circuit, a second input connected to the output of said second INVERTER circuit and an output;

a sixteenth AND circuit having a first input connected to said output of said first INVERTER circuit, a second input connected to said second source of binary test signals and an output;

a seventeenth AND circuit having a first input connected to said first source of binary test signals, a second input connected to said output of said second INVERTER circuit and an output;

an eighteenth AND circuit having a first input connected to said first clock source, a second input connected to said output of said fifteenth AND circuit and an output connected in common to said second input of said first AND circuit, said second input of said fourth AND circuit, said second input of said eighth AND circuit and said second input of said eleventh AND circuit;

a nineteenth AND circuit having a first input connected to said second source of clock pulses, a second input connected to said output of said fifteenth AND circuit and an output connected in common to said second input of said second AND circuit, said second input of said fifth AND circuit, said second input of said ninth AND circuit and said second input of said twelfth AND circuit;

a twentieth AND circuit having a first input connected to said first clock source, a second input connected to said output of said sixteenth AND circuit and an output connected in common to said second input of said third AND circuit and said second input of said tenth AND circuit;

a twenty-first AND circuit having a first input connected to said second clock source, a second input connected to said output of said sixteenth AND circuit and an output connected in common to said second input of said sixth AND circuit and said second input of said thirteenth AND circuit;

a twenty-second AND circuit having a first input connected to said first clock source, a second input connected to said output of said seventeenth AND circuit and an output connected to said second input of said seventh AND circuit;

a twenty-third AND circuit having a first input connected to said second clock source, a second input connected to said output of said seventeenth AND circuit and an output connected to said second input of said fourteenth AND circuit;

an input terminal connected in common to said first input of said first AND circuit, said first input of said third AND circuit and said first input of said seventh AND circuit; and an output terminal connected to said output of said eighth bistable latch circuit.

5. In an integrated circuit structure for performing a useful function, said integrated circuit structure including circuitry utilizable at least in part for electrically testing and checking said integrated circuit structure, as recited in claim 4, wherein the time duration of the clock pulses of said first source of clock pulses do not overlap in time the time duration of the clock pulses of said second source of clock pulses.

* * * * *